United States Patent [19]

Makita

[11] Patent Number: 4,722,629
[45] Date of Patent: Feb. 2, 1988

[54] ADAPTOR FOR ELECTRONIC ELEMENT STICK

[75] Inventor: Hajime Makita, Tokyo, Japan

[73] Assignee: Hakuto Co., Ltd., Tokyo, Japan

[21] Appl. No.: 883,698

[22] Filed: Jul. 8, 1986

[30] Foreign Application Priority Data

Jul. 8, 1985 [JP] Japan ................................ 60-149844

[51] Int. Cl.$^4$ .............................................. F16D 1/00
[52] U.S. Cl. ...................................... 403/24; 403/363
[58] Field of Search ................................. 403/563, 24

[56] References Cited

U.S. PATENT DOCUMENTS 4,417,373 11/1983 Keglewitsch ................... 403/363 X

FOREIGN PATENT DOCUMENTS 2109117 9/1972 Fed. Rep. of Germany ...... 403/363

Primary Examiner—Andrew V. Kundrat
Attorney, Agent, or Firm—Wenderoth, Lind & Ponack

[57] ABSTRACT

An adaptor is mounted on one end of a narrow-sized elongated electronic element stick which contains therein a number of electronic elements in a row. The stick is used with an electronic element dispenser which includes an inlet aperture and a guide frame having a pair of side walls for receiving and guiding the one end of the stick therebetween to lead the one end of the stick into a position adjacent to the inlet aperture of the dispenser. The adaptor comprises a base plate for supporting the bottom of the stick and a pair of elastic side walls extending upwardly and inwardly from opposed side edges of the base plate. The base plate of the adaptor has a width larger than the width of the bottom of the stick and slightly smaller than the spacing between the side walls of the guide frame. The elastic side walls of the adaptor is capable of elastically engaging the side surfaces of the stick so that the adaptor is held in position at the one end of the stick.

2 Claims, 11 Drawing Figures

ADAPTOR FOR ELECTRONIC ELEMENT STICK

BACKGROUND OF THE INVENTION

1. Field of the Invention

The present invention relates to an adaptor for electronic element sticks employed in automatic assembling of printed circuit boards.

2. Description of the Prior Art

An automatic inserter for assembling printed circuit boards has been known in which constituent electronic elements such as an IC chip, semiconductor, resistor and capacitor are delivered and installed in specified positions on the boards in an automatic manner. These various elements are supplied one by one to the inserter through respective dispensers. Each dispenser employs an elongated stick or tube which contains a number of electronic elements in a row.

In mass-scale production, a number of stacked sticks are provided for each dispenser. The inner ends of the stacked sticks are received between a pair of opposed side walls of a guide frame in the dispenser, and the elements loaded in the lowermost stick adjacent to an inlet of the dispenser are first unloaded. When the all the elements have been unloaded from the lowermost stick, this empty stick is ejected from the guide frame and the ensuing stick is guided downwardly in the guide frame to occupy the lowermost unloading position.

One serious problem concerned with the electric element sticks of the prior art is that the commercial sticks containing the respective elements differ in width from one another according to the makers. So long as the stick has a width slightly smaller than the fixed spacing between the side walls of the guide frame of the dispenser, the stick can be smoothly guided downwardly in the guide frame by gravity, with its attitude being kept proper.

However, in a case where the required electronic elements are loaded in a stick having too small a width and such a narrow-sized stick must be used, there has been an inconvenient tendency for the stick to tilt about its longitudinal axis within the guide frame of the dispenser. As the stacked sticks tilt randomly, they jam in the guide frame. Even if one of the sticks could reach the lowermost position, this stick might fail to be set in alignment with the inlet aperture of the dispenser.

SUMMARY OF THE INVENTION

It is, accordingly, an object of this invention to overcome the above disadvantage of the prior art.

The above disadvantage of the prior art can be eliminated by providing an adaptor for mounting on one end of a narrow-sized stick, which comprises a base plate having a width larger than the width of the bottom of the narrow-sized stick and slightly smaller than the spacing between the side walls of the guide frame of the dispenser, and a pair of elastic side walls extending upwardly and inwardly from the opposed side edges of the base plate and being capable of elastically engaging the side surfaces of the stick so as to hold the adaptor in position at the one end of the stick.

The narrow-sized stick with the adaptor constructed according to the present invention can be smoothly guided in the guide frame of the dispenser and can be set in the lowermost unloading position in alignment with the inlet aperture of the dispenser.

In the preferred embodiment, at least one end of the base plate of the adaptor may be formed with a cutout for exposing a recessed portion in the bottom of the stick having a substantially inverted U-shaped cross section.

BRIEF DESCRIPTION OF THE DRAWINGS

Other objects and advantages of this invention will be apparent from the following description in conjunction with the accompanying drawings in which:

FIG. 1b is a side view of the adaptor and the end portion of the stick shown in FIG. 1a;

FIG. 1c is a bottom view of the adaptor and the end portion of the stick shown in FIG. 1a;

FIG. 1d is a perspective view of the adaptor and the end portion of the stick shown in FIG. 1a;

FIG. 5b is a side view of the dispenser shown in FIG. 5a; and

DESCRIPTION OF THE PREFERRED EMBODIMENTS

Figure 2:
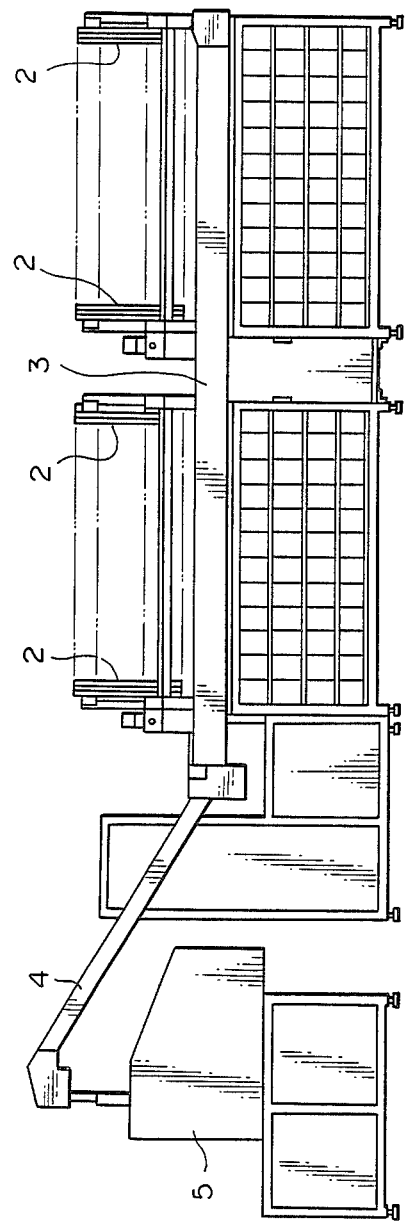
FIG. 2 is a schematic view showing the overall structure of a typical automatic inserter for supplying the electronic elements from a stick onto printed circuit boards.
Figure 3:
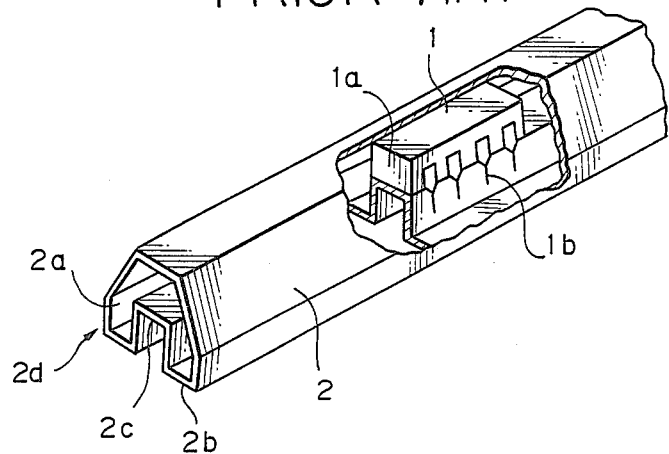
FIG. 3 is a perspective view of the stick loaded with the electronic element, a part thereof being removed to show the inside.
Figure 4:
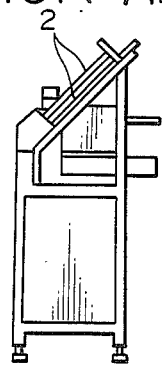
FIG. 4 is a side view of the inserter shown in FIG. 2.

FIGS. 2 and 4 show a typical automatic inserter. As shown in these drawings, a number of sticks 2 are laterally arranged and obliquely stacked on a carrier of the inserter. Each stick 2 is loaded with a number of electronic elements. As shown in FIG. 3, the stick 2 has an axially extending hollow 2a of substantially inverted U-shaped cross section. The hollow 2a is loaded from its open end 2d with electronic elements 1 each of which has a body 1a and leads 1b. The stick 2 also has a bottom 2b and a recesssed wall 2c.

Each set of stacked sticks 2 is loaded with the elements 1 of the same kind. However, the respective sets of stacked sticks 2 may contain elements 1 which are different from one another. The inner or lower end of the lowermost stick 2 of each set of stacked sticks 2 is adjacent to an inlet aperture of the corresponding dispenser. One dispenser is provided for each set of sticks 2.

The electronic elements 1 which are loaded in the lowermost stick 2 are selectively supplied by the respective dispensers to a first conveying section 3 and conveyed from right to left (as seen in FIG. 2) in the section 3 to an upwardly inclined second conveying section 4 leading to an inserting section 5. At the inserting section 5, the elements 1 are installed in specified positions on the printed circuit boards.

A spent stick, that is one which has become empty, is ejected downwardly to give a space for the next one which will be guided downwardly to the lowermost position for unloading the elements 1. In this manner, the supply of the elements 1 to the inserting section 5 is conducted continuously.

Figure 5A:
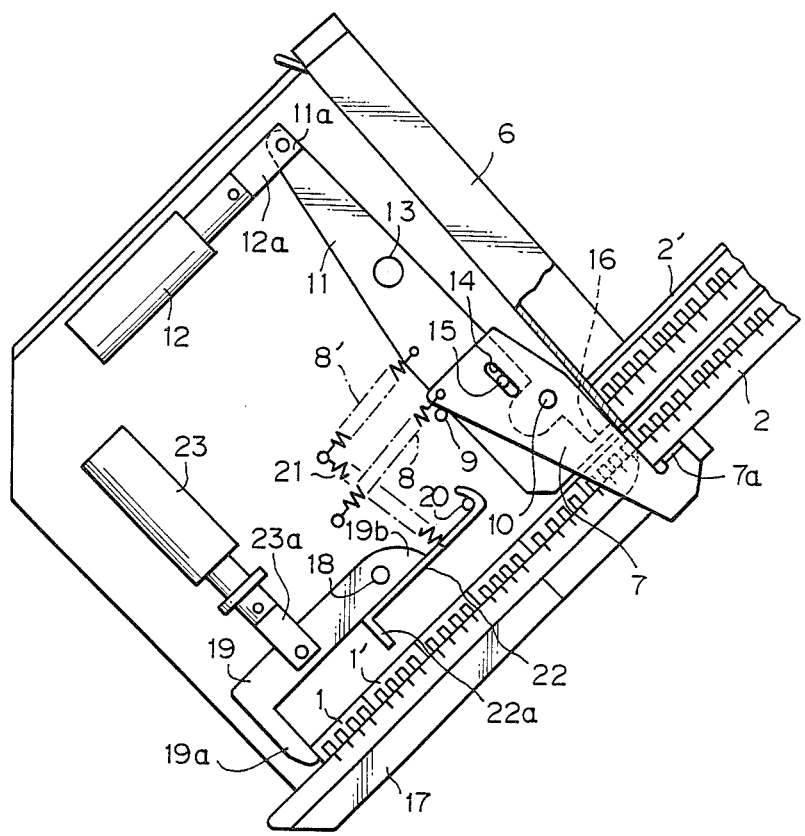
FIG. 5a is a front view of an example of a dispenser for handling electronic element sticks.
Figure 5B:
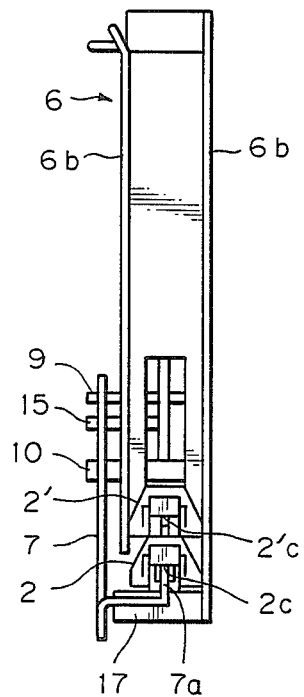
Figure 5C:
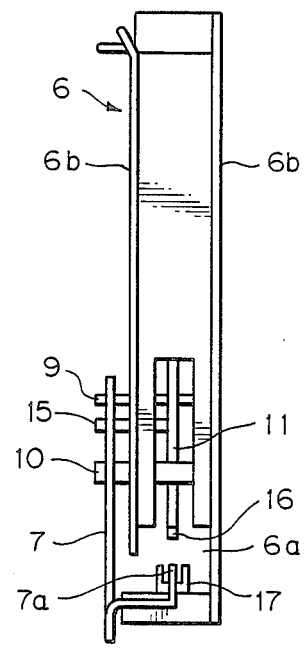
FIG. 5c is a side view of the dispenser, similar to FIG. 5b, but with the sticks removed.

FIGS. 5a through 5c illustrate in different views an example of a dispenser. The dispenser includes a guide frame 6 having an inlet aperture 6a defined at the lowermost part thereof, and a pair of opposed side walls 6b. In FIGS. 5a and 5b, only two sticks 2 and 2' are shown in the guide frame 6. The stick 2 is located in the lowermost unloading position and the stick 2' is located in the upper standby position. The inner ends of the sticks 2 and 2' are received in the guide frame 6.

As seen in FIG. 5b, each of the sticks 2 and 2' as shown has a proper width such that the sticks 2 and 2' can be guided smoothly between the side walls 6b of the guide frame 6 without jamming. However, as readily understood by those skilled in the art, if the sticks are too small in width, they would tilt about their longitudinal axes, this leading to their becoming jammed in the guide frame 6 or failing to be aligned with the inlet aperture 6a of the guide frame 6 in the lowermost position. Accordingly, such a narrow-sized stick needs the adaptor according to the present invention, the construction of which will be described later.

Referring to FIGS. 5a through 5c, a support lever 7 of the dispenser has an upturned supporting end 7a and is mounted at a pivot 10 for pivoting between a first support position, as shown in the drawings, in which the lever 7 holds the stick 2 in the lowermost unloading position by the end 7a engaging the recessed wall 2c of the stick 2, and a second release position in which the supporting end 7a is away from the recessed wall 2c of the stick 2, allowing it to fall from the lowermost unloading position into a discharge chute (not shown).

The lever 7 is urged in a counterclockwise direction (as seen in FIG. 5a) by a tension spring 8 and is prevented by a stop 9 from further rotating from the depicted position. Also, a slot 14 is formed in an upper part of the lever 7 to receive therein a pin 15 that is fixed on the opposed surface of an actuating lever 11, which is pivotally mounted at a pivot 13. A tension spring 8' is provided to urge the lever 11 to rotate in the clockwise direction, and the stop 9 also acts to prevent the lever 11 from further rotating from the depicted position. An upper end 11a of the lever 11 is pivotally connected to a forward end of a plunger 12a of a solenoid 12.

With this arrangement, when the solenoid 12 is energized to pull its plunger 12a, the lever 11 is caused to rotate counterclockwise as seen in FIG. 5a. Accordingly, the pin 15 urges the lever 7 to rotate in the clockwise direction through the slot 14 into the second release position. As a result, the support end 7a of the lever 7 is disengaged from the recessed wall 2c of the stick 2, allowing it to drop from the unloading position.

The lever 11 also has a support end 16 for holding the stick 2' in the upper standby position when the stick 2 drops from the unloading position. When the solenoid 12 is energized to rotate the lever 11 counterclockwise, the supporting end 16 projects rightward to engage a recessed wall 2'c of the stick 2'. In this moment, the lever 7 is in the second release position allowing the lowermost stick 2 to drop, but the next stick 2' is prevented from dropping and is held in the standby position by the supporting end 16. When the solenoid 12 is de-energized in the subsequent step, the lever 11 is rotated backward to the original (depicted) position in which the supporting end 16 is retracted to allow the stick 2' to move downwardly by gravity. At this stage, the lever 7 is returned to the first support position. Accordingly, the stick 2' is held in the lowermost unloading position by the supporting end 7a of the lever 7 engaging the recessed wall 2'c of the stick 2'.

The dispenser also includes a guide rail 17 for receiving the elements 1 unloaded from the stick 2 in the lowermost position and guiding them forwardly. The rail 17 is located in alignment with the inlet aperture 6a of the guide frame 6, and the top surface of the rail 17 is positioned at a height equal to or slightly lower than the height of the bottom surface of the element 1 loaded in the stick 2 in the lowermost position. Accordingly, the elements 1 are smoothly transferred from the stick 2 onto the rail 17 and are slidingly guided thereon.

The dispenser includes a control means for controlling the flow of the elements 1 as they are continuously unloaded from the sticks 2. This control means comprises a control lever 19 having a stop portion 19a formed at a forward end thereof. The lever 19 is rotatably mounted at a pivot 18 for rotation between a first stop position as depicted in FIG. 5a in which the stop portion 19a is lowered to engage the forward-most element 1 and hold it on the rail 17, and a second release position in which the stop portion 19a is lifted upwardly to allow the forwardmost element 1 to advance into the first conveying section 3 (FIG. 2). The lever 19 is connected to a solenoid 23 through a reciprocable plunger 23a.

A second control lever 22 is rotatably mounted at a pivot 20 and has an engaging portion 22a. A tension spring 21 is provided to urge the lever 22 in the clockwise direction as seen in FIG. 5a. An upper surface of the lever 22 is, accordingly, engaged with a lower surface of the rear end 19b of the lever 19 and further rotation of the lever 22 can thus be prevented. When the solenoid 23 is energized to retract the plunger 23a, the stop portion 19a of the lever 19 is lifted away from the leading end of the forwardmost element 1 and allows it to advance. At the same time, the lever 22 is urged to rotate counterclockwise so that the engaging portion 22a of the lever 22 comes into engagement with the top surface of the ensuing element 1' and hold it on the rail 17 such as not to slide down away from the rail 17. When the plunger 23a is extended, the levers 19 and 22 are returned to the depicted positions. Accordingly, the engaging portion 22a moves away from the element 1' to allow it to advance and the stop portion 19a is engaged with the leading end of the element 1' to hold it in the forwardmost position. In this manner, the electronic elements are supplied one by one into the first conveying section 3.

Referring to FIGS. 1a through 1d, there is shown an adaptor 24 according to one embodiment of the present invention, mounted around the bottom of one end of a stick 2 which is manufactured with a width which is too small for the spacing between the side walls 6b of the guide frame 6 of the existing dispenser as shown in FIGS. 5a to 5c. The adaptor 24 comprises a base plate 24a for supporting the bottom 2b of the stick 2, and a pair of side walls 24b extending from the side edges of the base plate 24a. The base plate 24a has a width which is slightly smaller than the spacing between the side walls 6a of the guide frame 6 of the existing dispenser so as to enable the stick 2 with the adaptor 24 to smoothly move in the guide frame 6 without tilting therein. The side walls 24b extend upwardly and inwardly from the side edges of the base plate 24a.

The adaptor 24 can be made of a thin elastic material such as metal sheet or others so that it can be elastically snapped onto the bottom of the narrow-sized stick 2 and held in position without accidentally falling off from the mounted position, with the upper portions of the side walls 24b engaging the side walls 2e of the stick 2.

Preferably, the base plate 24a is formed with a cutout 24c to permit the supporting end 7a of the lever 7 of the dispenser as shown in FIGS. 5a to 5c to move therethrough and into a recess 2f to engage the recessed wall 2c of the stick 2. In a more preferred embodiment, the cutout 24c may be formed at both ends of the base plate 24a so that the adaptor 24 can be mounted onto the stick 2 from both directions.

Figure 1A:
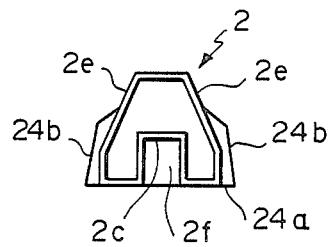
FIG. 1a shows a front view of a preferred embodiment of the adaptor constructed according to the present invention, together with one end portion of a stick on which the adaptor is mounted.
Figure 1B:
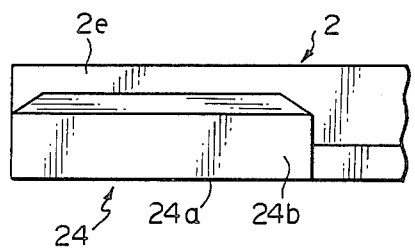
Figure 1C:
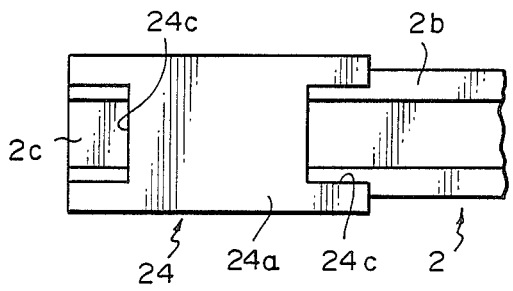
Figure 1E:
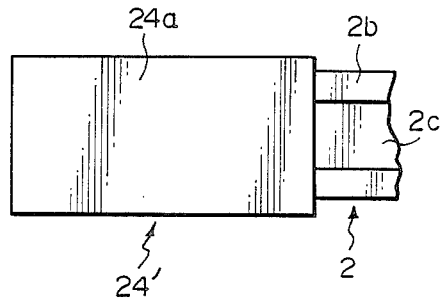
FIG. 1e shows a bottom view of another embodiment of the adaptor constructed according to the present invention, together with one end portion of a stick on which the adaptor is mounted.
Figure 1D:
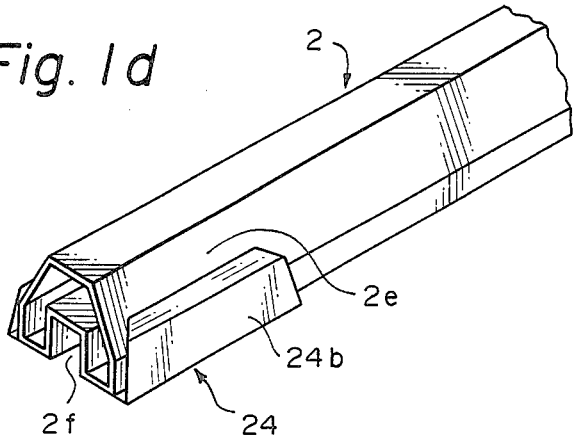

In some dispensers different in construction from that shown in FIGS. 5a to 5c, the lever 7 has a supporting end extending in parallel with the bottom 2b of the stick 2 to support the bottom 2b. In a case where the adaptor according to the present invention is used in the dispenser of such a type, the adaptor 24' without a cutout as shown in FIG. 1e can be used. However, the adaptor 24 with the cutout 24c can also be used in this case.

What is claimed is:

1. An adaptor for mounting on one end of a narrow-sized elongated electronic element stick of the type having an axially extending hollow of substantially inverted U-shaped cross section open at the one end for containing therein a number of electronic elements in a row, the stick being used with an electronic element dispenser of the type including an inlet aperture and a guide frame having a pair of side walls for receiving and guiding the one end of the stick therebetween to lead the one end into a position adjacent to the inlet aperture of the dispenser, said adaptor comprising a base plate for supporting the bottom of the stick and a pair of elastic side walls, said side walls having an upwardly extending portion extending upwardly from the opposed side edges of said base plate, said side walls having an inwardly extending portion on the upper end of said upwardly extending portion, and said elastic side walls of the adaptor engaging the outside side surfaces of the stick, wherein said adaptor is held in position on the one end of the stick.

2. The adaptor of claim 1, further comprising at least one end of said base plate having a cutout, at the edge thereof, said cutout exposing a portion of the inverted U-shaped cross section in the bottom of the stick when said adaptor is mounted on the one end of the stick.

* * * * *